(12) United States Patent
Liebeskind

(10) Patent No.: US 6,534,850 B2
(45) Date of Patent: Mar. 18, 2003

(54) ELECTRONIC DEVICE SEALED UNDER VACUUM CONTAINING A GETTER AND METHOD OF OPERATION

(75) Inventor: John Liebeskind, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/836,061

(22) Filed: Apr. 16, 2001

(65) Prior Publication Data

US 2002/0149096 A1 Oct. 17, 2002

(51) Int. Cl.[7] ............... H01L 23/20; H01L 23/06; H01L 21/44; H01L 21/48; H01L 21/50
(52) U.S. Cl. ............... 257/682; 257/729; 438/115
(58) Field of Search ................ 257/682, 729; 438/115

(56) References Cited

U.S. PATENT DOCUMENTS

| | | | |
|---|---|---|---|
| 4,710,344 A | * 12/1987 | Ward et al. | 29/527.2 |
| 4,719,477 A | 1/1988 | Hess | 346/140 R |
| 5,122,812 A | 6/1992 | Hess et al. | 346/1.1 |
| 5,159,353 A | 10/1992 | Fasen et al. | 346/140 R |
| 5,293,511 A | * 3/1994 | Poradish et al. | 257/432 |
| 5,453,659 A | 9/1995 | Wallace et al. | 313/495 |
| 5,610,438 A | 3/1997 | Wallace et al | 257/682 |
| 5,736,995 A | 4/1998 | Bohorquez et al. | 347/14 |
| 5,934,964 A | 8/1999 | Carella et al. | 445/25 |
| 6,042,443 A | 3/2000 | Carella et al. | 445/24 |
| 6,139,390 A | 10/2000 | Pothoven et al. | 445/41 |
| 6,127,777 A1 | 10/2001 | Watkins et al. | 313/554 |

* cited by examiner

Primary Examiner—David E. Graybill
(74) Attorney, Agent, or Firm—Donald J. Coulman

(57) ABSTRACT

An electronic device that is sealed under vacuum includes a substrate, a transistor formed on the substrate, and a dielectric layer covering at least a portion of the transistor. The electronic device further includes a layer of non-evaporable getter material disposed on a portion of the dielectric layer; and a vacuum device disposed on a portion of the substrate. Electrical power pulses activate the non-evaporable getter material.

35 Claims, 12 Drawing Sheets

ELECTRONIC DEVICE SEALED UNDER VACUUM CONTAINING A GETTER AND METHOD OF OPERATION

FIELD OF THE INVENTION

This invention relates generally to electronic devices that incorporate a vacuum packaged microelectronic device. More particularly, the present invention relates to an electronic device having a non-evaporable getter material disposed on the same substrate as the active transistors and other logic devices.

BACKGROUND OF THE INVENTION

The ability to maintain a vacuum for a prolonged period in a microelectronic package is increasingly being sought in such diverse areas as field emission displays (FEDs), micro-electro-mechanical systems (MEMS) and atomic resolution storage devices (ARS) that are used in connection with computers, displays, television sets as a few examples. Both FEDs and ARS typically require two surfaces juxtaposed to one another across a narrow vacuum gap. Typically, electrons must transverse this gap either to excite a phosphor in the case of FEDs or to modify a media to create bits in the case of ARS.

One of the major problems with vacuum packaging of electronic devices is the continuous outgassing of hydrogen, water vapor, and other components found in ambient air from the internal components of the electronic device. This is especially true for polymers such as epoxies and polyimides, which are widely used in the electronic industry. To minimize the effects of outgassing one typically uses gas-absorbing materials commonly referred to as getter materials. Normally the getter material is incorporated into a separate cartridge, which is inserted into the electronic vacuum package. Thus, in order to maintain a vacuum over the lifetime of the electronic device a sufficient amount of getter material must be contained within the cartridge or cartridges before the cartridge or cartridges are sealed within the vacuum package. In addition, connections to or a means of activating the getter material once it is sealed within the vacuum package is also required. Further a path of sufficient cross sectional area to allow for the gaseous material outgassing from various surfaces of the device to impinge upon the surface of the getter material is necessary for efficient pumping action.

In conventional getter cartridges the getter material is deposited onto a metal substrate and then activated using, electrical resistance, RF, or laser power to heat the getter material to a temperature at which the passivation layer on the surface diffuses into the bulk of the material. Non-evaporable getter material is activated in a temperature range of 450–900° C. depending on the particular material used. At these temperatures both active devices as well as polymeric materials will be damaged and/or deformed. In order to avoid these damaging effects the getter material must be kept apart from the actual device, thus leading to a bulkier package as well as greater difficulty in assembly. In addition, the incorporation of a separate cartridge, especially for small electronic devices with narrow vacuum gaps, also results in a bulkier package. Further, the utilization of a separate cartridge increases the cost of manufacturing because it is a separate part that requires accurate positioning and then it must be secured to another component part to prevent it from coming loose. Loose cartridges are a potential serious problem by either acting as a source of small particles that break away from the cartridge or create particles from materials the cartridge is in contact with.

SUMMARY OF THE INVENTION

An electronic device that is sealed under vacuum includes a substrate, a transistor formed on the substrate, and a dielectric layer covering at least a portion of the transistor. The electronic device further includes a layer of non-evaporable getter material disposed on a portion of the dielectric layer, and a vacuum device disposed on a portion of the substrate. Electrical power pulses activate the non-evaporable better material.

DETAILED DESCRIPTION

Figure 1A:
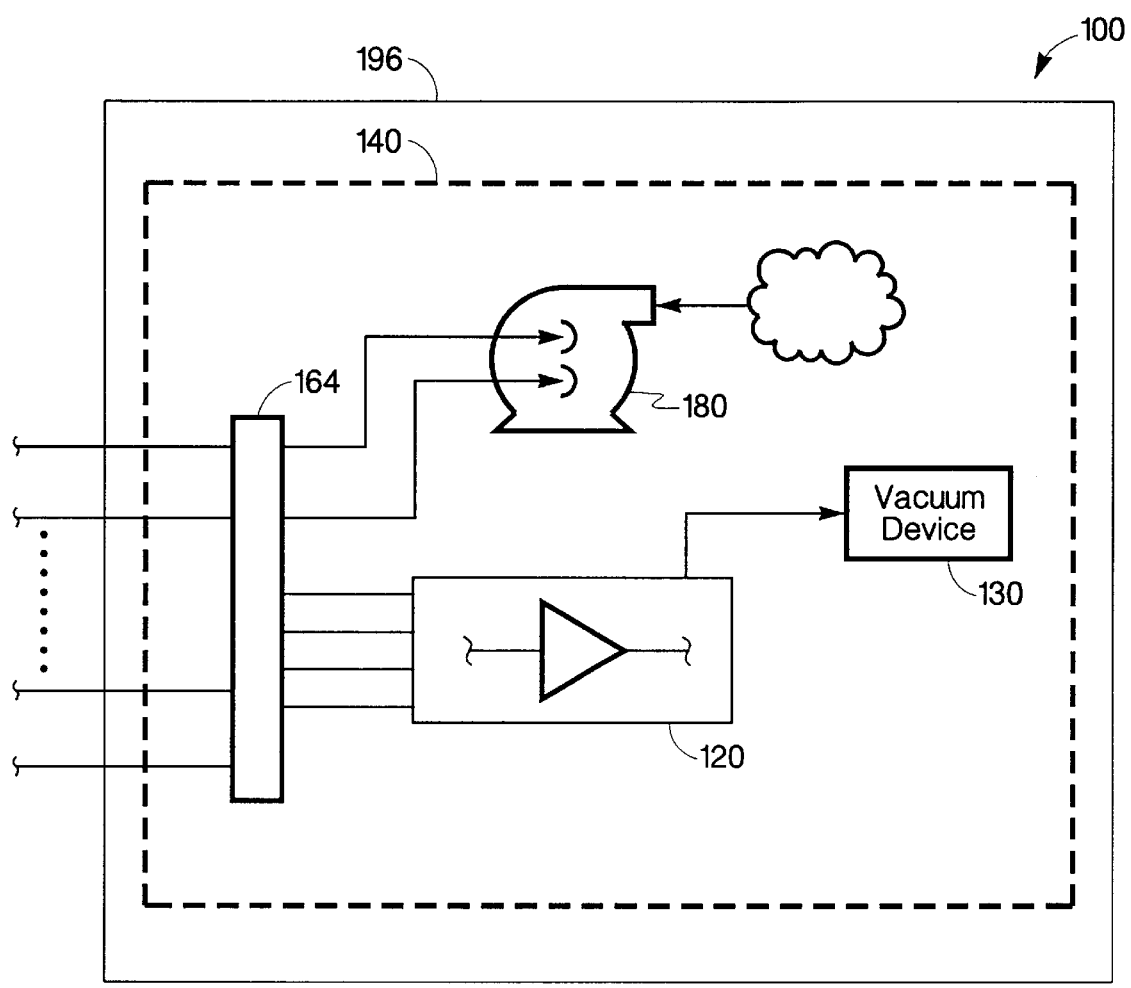
FIG. 1a is a block diagram of an electronic device sealed under a vacuum according to a first embodiment of this invention.
Figure 2:
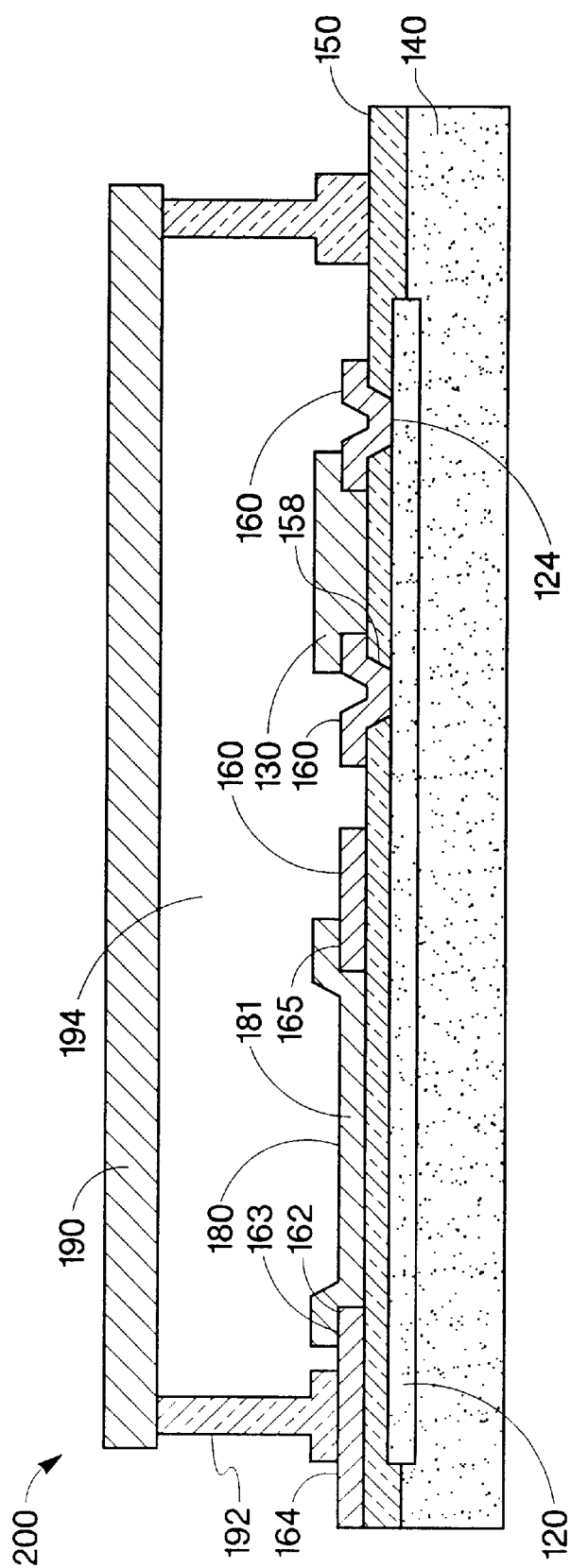
FIG. 2 is a cross-sectional view of an electronic device sealed under a vacuum according to the first embodiment of this invention.

FIG. 1a is a block diagram of an electronic device sealed and maintained under vacuum, according to an embodiment of this invention. This device is referred to as electronic device 100 utilizing non-evaporable getter pump 180 (hereinafter NEG pump 180) to assist in evacuation, sealing, and maintenance of the vacuum during operation. Electronic device 100 includes the integration of NEG pump 180, vacuum device 130, and transistors 120 onto substrate 140 enclosed in package 196 that is vacuum-sealed. Vacuum device 130 relates to any electronic device that requires a vacuum to operate such as a charged particle emitter (e.g.

electron or ion). Bond pads 164 are also affixed to substrate 140 providing electrical input and output. In this embodiment, there is a direct electrical connection between bond pads 164 and NEG pump 180; thus, this embodiment is commonly referred to as direct drive. NEG pump 180 includes non-evaporable getter material 181 (hereinafter NEG material 181) as shown in FIG. 2.

An important aspect of the present invention is the deposition of the non-evaporable getter material directly onto the substrate utilized for both vacuum device 130 and transistors 120. This provides a reduction in the size of package 196 as well as the elimination of a separate getter cartridge that is utilized conventionally. In addition, another important aspect is the ability to directly heat NEG material 181 (see FIG. 2) to its activation temperature of between 400° C.–900° C. without damaging transistors 120 or vacuum device 130.

Figure 1B:
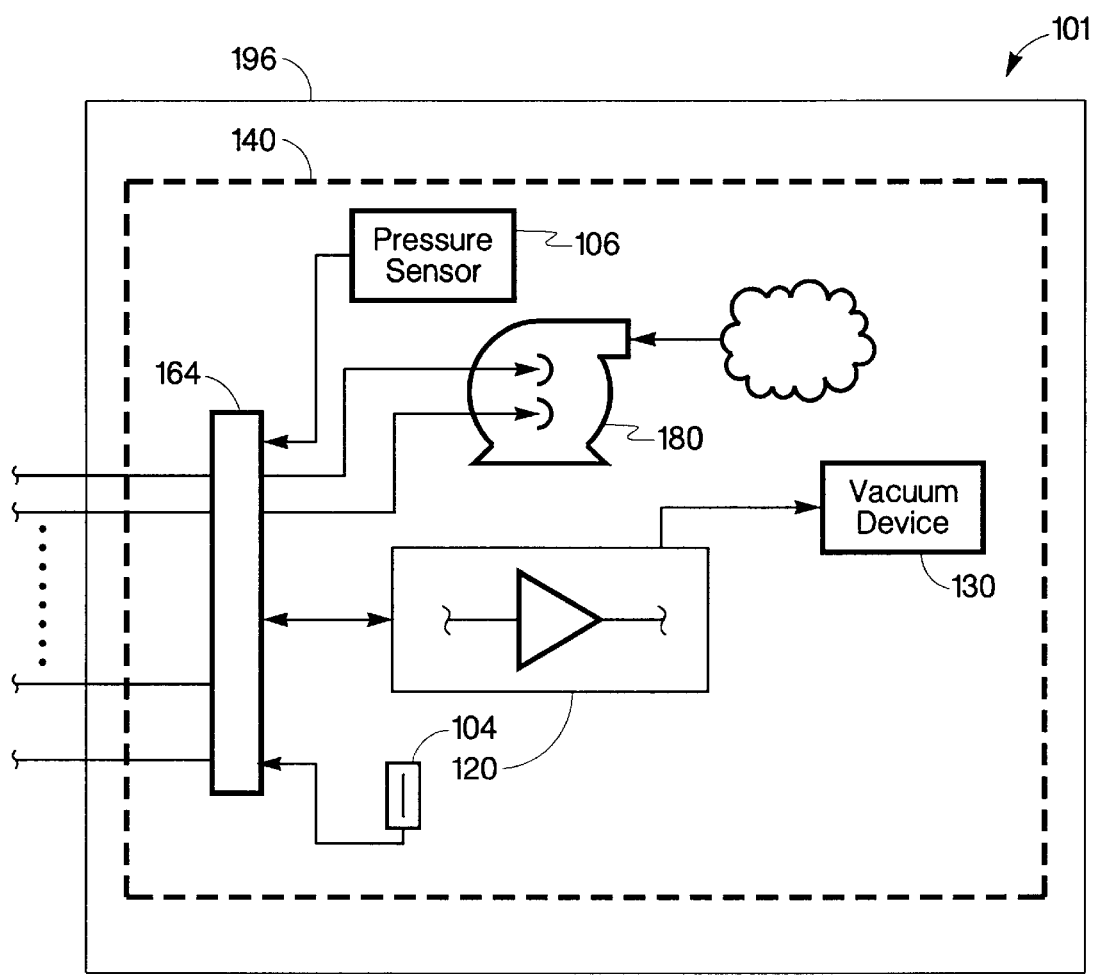
FIG. 1b is a block diagram of an electronic device sealed under a vacuum according to a second embodiment of this invention.

An alternate embodiment of the present invention is shown in block form in FIG. 1b. In this embodiment, electronic device 101 includes temperature sensor 104, and pressure sensor 106, to measure the temperature of substrate 140 and the pressure within package 196 respectively. When pressure sensor 106 senses a pressure within package 196 greater than a predetermined pressure NEG pump 180 is activated. Further when temperature sensor 104 senses a substrate temperature greater than a predetermined temperature electrical power pulses to NEG pump 180 will be stopped, adding further protection to transistors 120 and vacuum device 130.

Figure 1C:
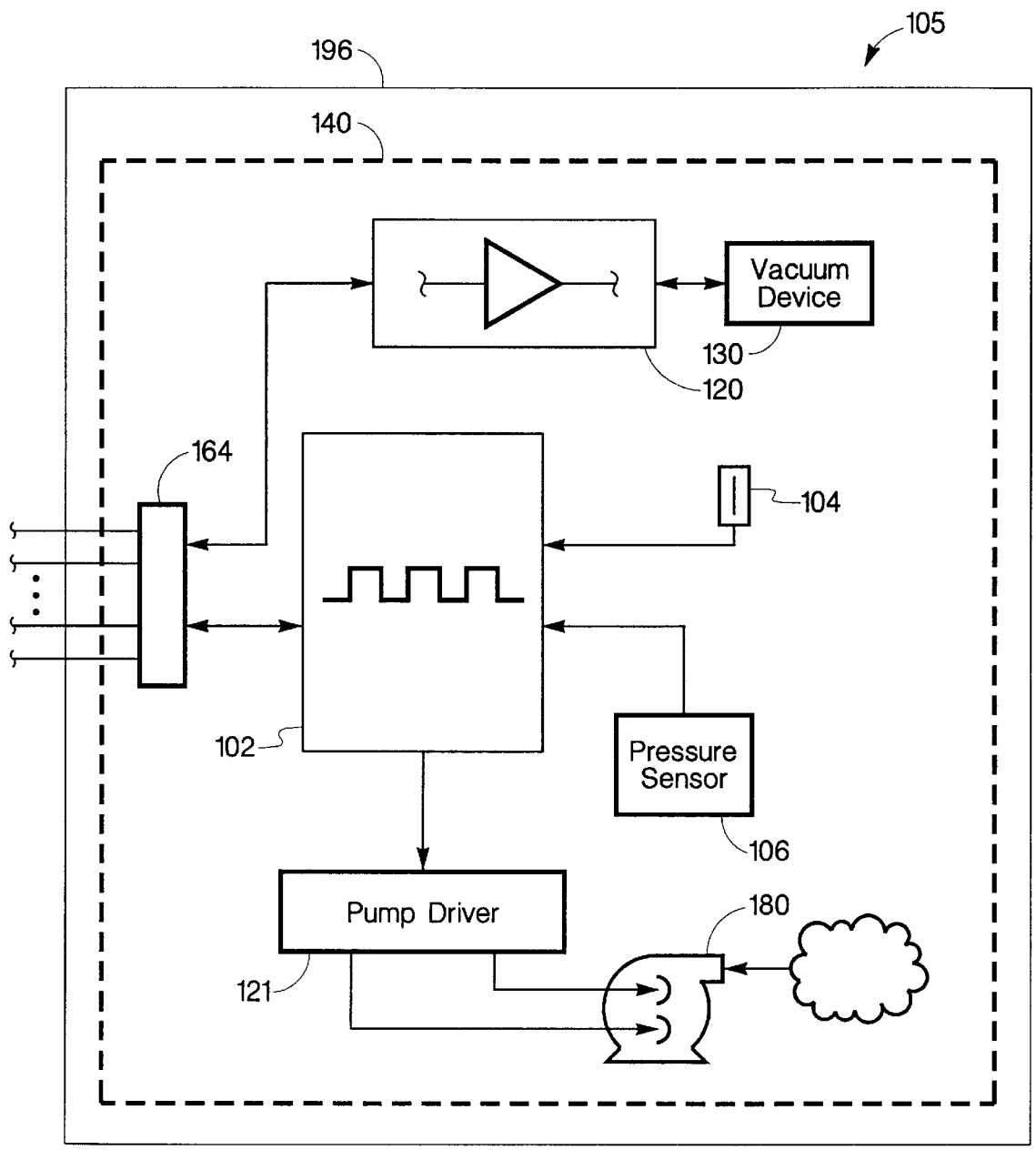
FIG. 1c is a block diagram of an electronic device sealed under a vacuum according to a third embodiment of this invention.

An alternate embodiment of the present invention is shown in block form in FIG. 1c. In this embodiment, electronic device 105 includes temperature sensor 104, pressure sensor 106, pump driver 121, and pulse generator 102 are all integrated with vacuum device 130, NEG pump 180 and transistors 120 on substrate 140. Temperature sensor 104 measures the temperature of substrate 140 and pressure sensor 106 measures the pressure within package 196. In this embodiment, temperature sensor 104 and pressure sensor 106 are used to gate the electrical power pulses generated by pulse generator 102. When pressure sensor 106 senses a pressure within package 196 greater than a predetermined pressure, pulse generator 102 will send a signal to pump driver 121 to apply electrical power pulses to NEG pump 180. The predetermined pressure is in the range of $10^{-2}$ to $10^{-5}$ torr and is preferably greater than $10^{-3}$ torr. When temperature sensor 104 senses a substrate temperature greater than a predetermined temperature pulse generator 102 will not apply electrical power pulses to NEG pump 180. The predetermined temperature is in the range of 300° C. to 500° C. and is preferably 400° C. or greater. Thus pressure sensor 106 determines when to activate NEG material 181 (see FIG. 2) and temperature sensor 104 protects transistors 120 and vacuum device 130 from damage while heating NEG material 181 to its activation temperature between 400° C.–900° C. This embodiment further provides an ability to increase the gettering action of NEG pump 180 while providing protection of transistors 120 and vacuum device 130.

Figure 1D:
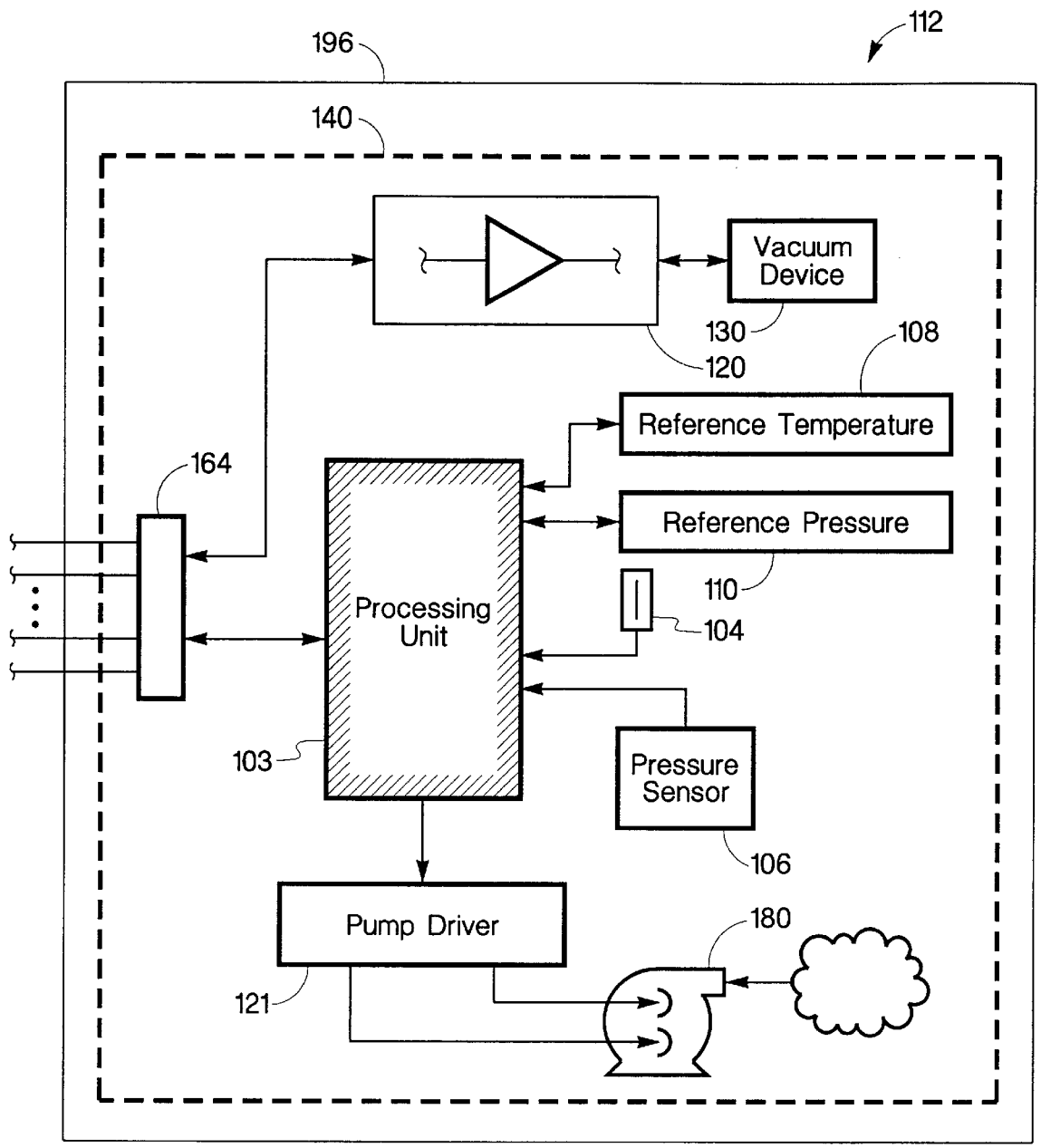
FIG. 1d is a block diagram of an electronic device sealed under a vacuum according to a fourth embodiment of this invention.

An alternate embodiment of the present invention is shown in block form in FIG. 1d. In this embodiment, electronic device 112 includes temperature sensor 104, pressure sensor 106, reference temperature 108, reference pressure 110, processor unit 103 and pump driver 121 are all integrated with vacuum device 130, NEG pump 180 and transistors 120 on substrate 140. Reference temperature 108 and reference pressure 110 along with the outputs of temperature sensor 104 and pressure sensor 106 are acquired by processor unit 103 to calculate both a pulse width and pulse repetition rate which is utilized by pump driver 121. Pump driver 121 applies electrical power pulses to NEG pump 180 to directly heat NEG material 181 (see FIG. 2) to its activation temperature between 400° C.–900° C. without damaging transistors 120 nor vacuum device 130. This embodiment further provides an ability to maximize the gettering action of NEG pump 180 while providing enhanced protection of transistors 120 and vacuum device 130.

FIG. 2 schematically illustrates in a cross-sectional view the construction of an embodiment of electronic device 200 of the present invention having integrated NEG pump 180, vacuum device 130, and transistors 120. With reference to FIG. 2 substrate 140 is preferably manufactured using a silicon wafer having a thickness of about 600–800 microns. Next using standard semiconductor processing steps, known to those skilled in the art, transistors 120 as well as other logic devices required for electronic device 100 are formed in substrate 140.

Transistors 120 are represented as only a single layer in FIGS. 2–5 to simplify the drawing. Those skilled in the art will appreciate that transistors 120 can be realized as a stack of thin film layers. The particular structure of transistors 120 is not relevant to the invention, however some type of solid state electronic device is preferably present, such as, metal oxide field effect transistors (MOSFET), bipolar junction transistors (BJT), or other temperature sensitive device. Transistors 120 are exemplary of any semiconductor device whose operation is degraded by high temperatures such as greater than 400° C. Normally there is a passivation layer on the surface of NEG material 181 when exposed to ambient conditions. However, when heated to a high temperature the passivation layer diffuses into the bulk of NEG material 181 resulting in activation of NEG material 181. This process of activation forms a clean surface upon which additional material may adsorb. The actual temperature used for activation depends on the particular composition of NEG material and is preferably in the range of 400° C.–900° C.

Dielectric layer 150 is disposed over transistors 120 as well as other logic devices on substrate 140. Dielectric layer 150 provides thermal insulation protecting transistors 120 as well as other logic devices from high temperature during operation of NEG pump 180. Preferably, dielectric layer 150 is silicon oxide ($Si_xO_y$) however, those skilled in the art will appreciate that other dielectric materials such as silicon nitride, silicon carbide, aluminum oxide, boron nitride and other low thermal conductivity materials as well as various combinations thereof can be utilized. For example dielectric layer 150 can include a first dielectric layer of silicon oxide ($Si_xO_y$) disposed over transistors 120 with a second dielectric layer of silicon nitride ($Si_xN_y$) disposed over the silicon oxide layer and a third dielectric layer of silicon carbide disposed over the silicon nitride layer.

Conductive layer 160 is disposed over dielectric layer 150 and electrically couples to electrical contact regions 124 of transistors 120 through via openings 158 formed in dielectric layer 150. Vacuum device 130 is disposed over a portion of dielectric layer 150. Preferably, vacuum device 130 is an electron emitter device commonly referred to as a Spindt tip or flat emitter. Those skilled in the art will readily recognize that vacuum device 130 can also be a digital mirror device, digital micro mover as well as other devices utilized in field emission displays, atomic resolution storage systems and micro-electro-mechanical systems (MEMS) that are incorporated within a vacuum package.

Conductive layer 160 routes signals from transistors 120 as well as other logic devices to vacuum device 130 and from bond pads 164 to NEG pump 180 as well as vacuum device 130. In this embodiment, commonly referred to as "direct drive," conductive layer 160 makes an electrical connection between the bond pads 164 and first and second overlapping areas 163 and 165. In a preferred embodiment, conductive layer 160 may consist of aluminum, copper, or gold, with aluminum being preferred. In addition, the metals used to form conductive layer 160 may be doped or combined with other materials, including copper and/or silicon. In general, conductive layer 160 will have a uniform thickness of about 2000–7000 angstroms (about 5000 angstroms is preferable), and is applied using conventional sputtering or vapor deposition techniques.

NEG material 181 is disposed over a portion of dielectric layer 150 through conductor opening 162. First and second overlapping areas 163 and 165 between conductive layer 160 and NEG material 181 are chosen to minimize the heat loss of NEG material 181 when heated and to minimize the electrical resistance of the electrical contact between NEG material 181 and conductive layer 160. The thickness and resistivity of NEG material 181 together with the two-dimensional pattern between first and second overlapping areas 163 and 165 determines the resistance of NEG material 181. The power applied to NEG material 181 determines the rate of temperature increase. The area and volume of NEG material 181 determines the getter capacity of NEG pump 180. Getter materials include titanium, zirconium, thorium, and molydenum. Preferably, the getter material is a zirconium-based alloy such as Zr—Al, Zr—V, or Zr—V—Fe alloys. NEG material 181 is preferably applied using conventional sputtering or vapor deposition techniques. However, those skilled in the art will appreciate that electrophoresis, manual, or mechanical application, such as sprays or suspensions of the getter material in a suspending medium, can also be utilized. In general, NEG material 181 will have a uniform thickness between 0.1–150 microns about 1 micron is preferable.

A significant advantage of the present invention as shown in FIG. 2 is that a single substrate such as silicon can be used for the fabrication of MOSFET or bipolar driver transistors in and for the fabrication of non-evaporable getter pumps. These various devices may then be interconnected using standard multi-level metal interconnect technology that is well known in the art of semiconductor manufacturing.

As shown in FIG. 2 vacuum seal 192 is disposed on substrate 140 and cover 190 is affixed to vacuum seal 192 such that interspace region 194 is maintained at a pressure of less than $10^{-3}$ torr. Preferably, the vacuum is maintained at a pressure of less than $10^{-5}$ torr. Those skilled in the art will appreciate that the seal can be made by a variety of techniques including thermal compression, brazing, anodic bonding, as well as other techniques.

Figure 3:
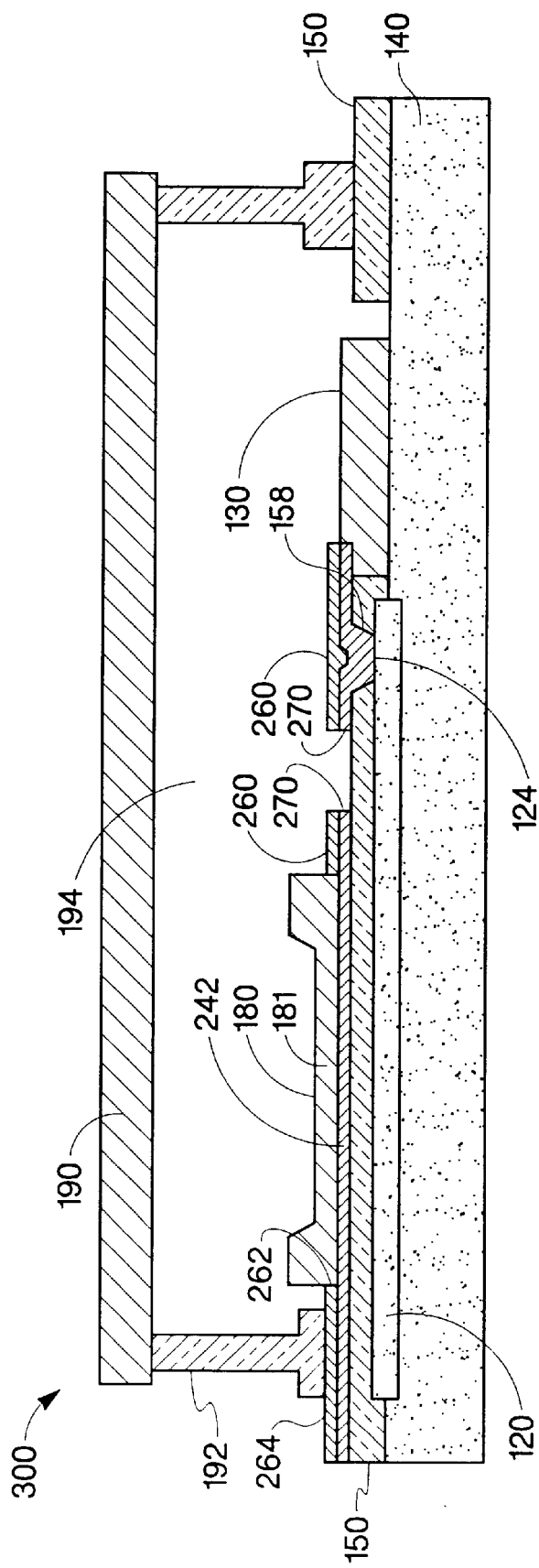
FIG. 3 is a cross-sectional view of an electronic device sealed under a vacuum according to an alternate embodiment of this invention.

FIG. 3 schematically illustrates the construction of an alternate embodiment of the present invention, showing electronic device 300 utilizing electrically resistive layer 270 to provide the heating mechanism for NEG material 181. In this embodiment substrate 140, transistors 120, dielectric layer 150, and vacuum device 130 are substantially the same as shown in FIG. 2. Electrically resistive layer 270 is disposed over dielectric layer 150 and electrically couples to electrical contact regions 124 of transistors 120 through via openings 158 formed in dielectric layer 150. In addition, electrically resistive layer 270 forms heater 242 to activate NEG material 181 in NEG pump 180. Vacuum device 130 is disposed over a portion of substrate 140. Conductive layer 260 is disposed over electrically resistive layer 270. In this embodiment, conductive layer 260 and electrically resistive layer 270 route signals from transistors 120 as well as other logic devices to vacuum device 130 and from bond pads 264 to both NEG pump 180 and vacuum device 130.

NEG material 181 is disposed on a portion of resistive layer 270 within conductor opening 262. In this embodiment, the thickness and resistivity of electrically resistive layer 270 together with the two-dimensional pattern of electrically resistive layer 270 underneath NEG material 181 determines the resistance of heater 242. The power applied to heater 242 determines the rate of temperature increase of NEG material 181. The addition of heater 242 in this embodiment has the primary advantage that it enables the use of getter materials, which have a high resistivity.

Figure 4:
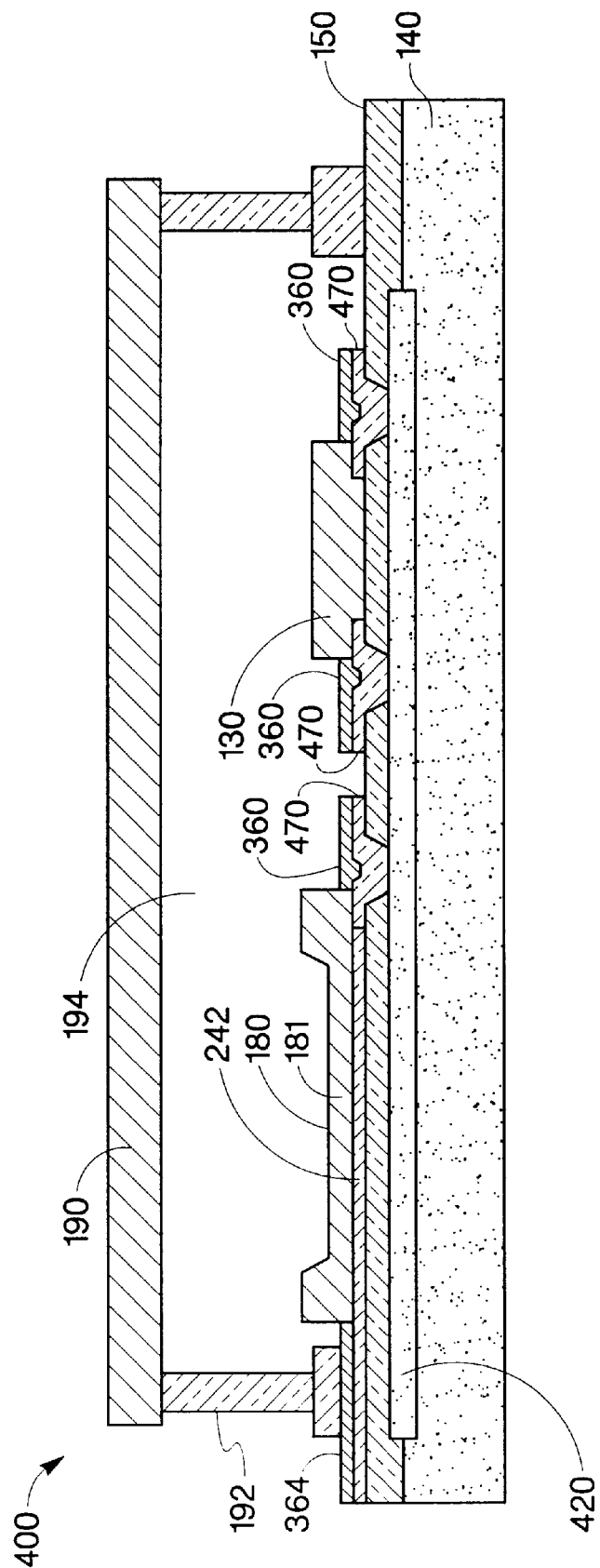
FIG. 4 is a cross-sectional view of an electronic device sealed under a vacuum according to an alternate embodiment of this invention.

FIG. 4 schematically illustrates the construction of an alternate embodiment of the present invention, showing electronic device 400 where heater 242 is coupled to transistors 420. This embodiment, commonly referred to as "integrated drive" provides several advantages over "direct drive" such as an increased number of NEG pumps disposed on electronic device 400 without significantly increasing the number of bond pads, optimized location and control of NEG pumps, and smaller chip size which all lead to lower cost. In this embodiment, both conductive layer 360 and electrically resistive layer 470 route signals from transistors 420 as well as other logic devices to both vacuum device 130 and to NEG pump 180. The coupling of heater 242 to transistors 420 further provides an ability to increase the getter action of NEG pump 480 while providing enhanced protection of transistors 420 and vacuum device 130. Those skilled in the art will appreciate that the single conductive layer 160 shown in FIG. 2 can also be utilized in the embodiment shown in FIG. 4.

Figure 5A:
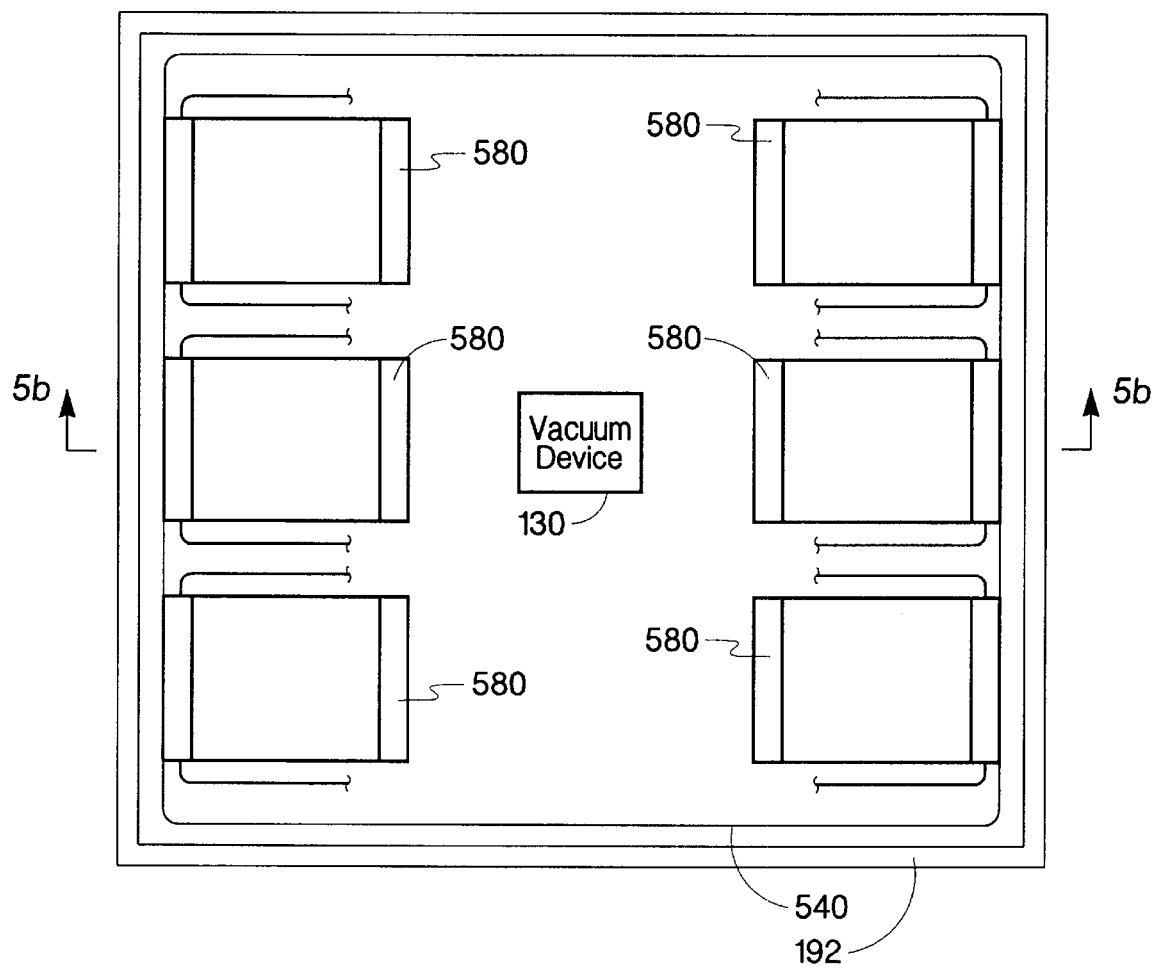
FIG. 5a is a schematic view of an electronic device sealed under a vacuum according to an alternate embodiment of this invention.
Figure 5B:
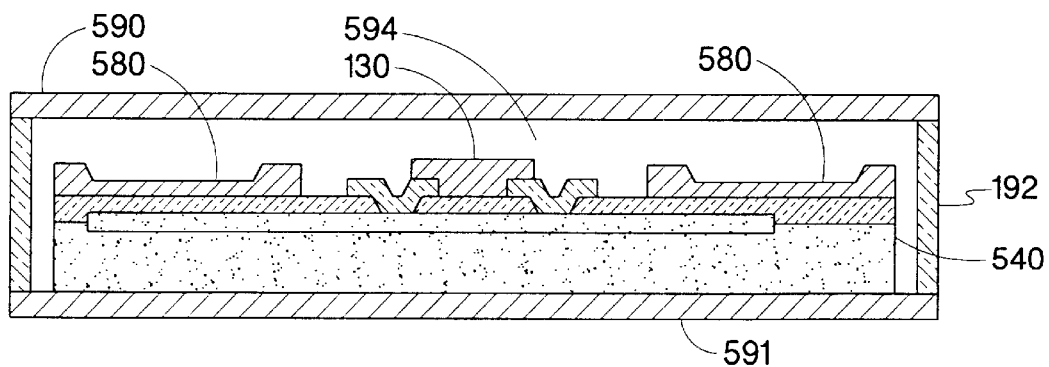
FIG. 5b is a cross-sectional view of an electronic device sealed under a vacuum according to an alternate embodiment of this invention.

FIG. 5a schematically illustrates a layout of an alternate embodiment of the present invention with cover 590 removed (see FIG. 5b), showing multiple NEG pumps 580 disposed around the periphery of electronic device 500. The advantage of this embodiment is the ability to utilize regions of substrate 540 which would not be as fully utilized by active devices because of the potential for damage during the singulation process when forming discreet devices from the silicon wafer. In this embodiment, the constructions of the NEG pump, the transistors, and the vacuum device shown in alternate embodiments in FIGS. 2–4 can all be utilized. FIG. 5b shows substrate 540 disposed within cover 590, base 591, and vacuum seal 192. Substrate 540 is mounted to base 591 forming interspace 594 between cover 590 and vacuum device 130. Also shown in FIG. 5b is NEG material 581 at the periphery of substrate 540 as well as vacuum device 130.

Figure 6:
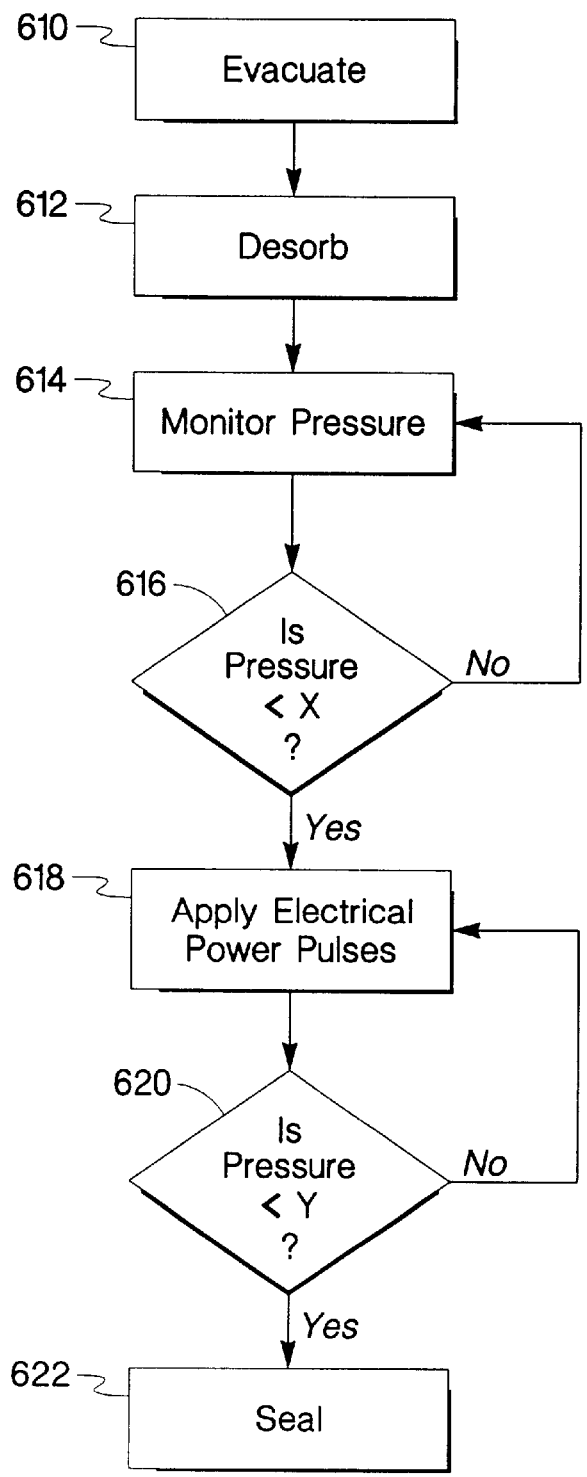
FIG. 6 is a flow diagram of a method for activating the NEG material according to an embodiment of this invention.

FIG. 6 shows a flow diagram of a method for activating NEG pump 180 as depicted in FIGS. 1a–1d. At step 610 electronic device 100 is placed in a vacuum chamber at a temperature less than 80° C. and the device is evacuated to a pressure of less than 0.1 torr. At step 612 if thermal energy is being utilized the temperature of the chamber is increased to a temperature preferably greater than 100° C. Those skilled in the art will appreciate that other energy sources may be utilized to desorb adsorbed material from the exposed surfaces of electronic device 100. For example, photons, (in particular photons in the ultraviolet region of the spectrum), or electrons or ions or other charged particles can also be utilized. At temperatures above 100° C. adsorbed material such as water more readily desorbs from the exposed surfaces of electronic device 100. Temperatures below 100° C. can also be utilized, however, the time necessary to get to the desired pressure will typically become unduly long, especially as room temperature is approached. The higher the temperature the more rapid the desorption will occur. Thus, the preferable conditions are dependent on the particular vacuum chamber utilized. The number of devices in the vacuum chamber for each pump down, the pump down time, the degree of control over the rate of heating are just a few of the parameters that need to be experimentally determined. The optimum conditions are obtained by balancing the time, pumping speed, and temperature to obtain the steady state pressure desired in a reasonable time. The greater the pumping speed and/or temperature the shorter the time to reach a steady state.

Step 614 consists of monitoring the pressure of interspace region 194. At step 616 the pressure is compared to a pre-selected value X, if the pressure is less than the pre-selected value X then the process moves to step 618. Preferably the preselected value X for the pressure in the interspace region is less than $1\times10^{-5}$ torr, however, pressures less than $1\times10^{-3}$ torr are sufficient for many purposes. At step 618 electrical power pulses (see FIG. 8) are applied to NEG material 181 to heat NEG material 181 to its activation temperature. Getter activation occurs when the passivation layer on the surface of NEG material 181 diffuses into the bulk of the material. The higher the temperature NEG material 181 is raised to, the higher the diffusion rate of the passivation layer, and thus the shorter time necessary to heat NEG material 181. After a predetermined number of electrical power pulses have been applied to NEG material 181 the pressure in the interspace region is measured and compared to a desired pressure in step 620. If the pressure is not less than the desired value Y then step 618 is repeated and additional electrical power pulses are applied to NEG material 181. This sequence of steps (steps 618–620) is repeated until the desired pressure is obtained. The value of the desired pressure is dependent on the pre-selected value at which activation is started as well as the amount of NEG material 181 present on substrate 140 of electronic device 100. The lower the pre-selected value X and the greater the amount of NEG material 181 present on substrate 140 the longer the pumping capability of NEG pump 180 will be maintained. Thus, by maximizing the amount of NEG material 181 and minimizing the pre-selected value X for pressure the lifetime of NEG pump 180 will be maximized.

Once the desired pressure is obtained in step 620, step 622 is performed resulting in the sealing of electronic device 100. Those skilled in the art will appreciate that the sealing of electronic device 100 (e.g. step 622) can also be performed after step 616 with subsequent activation of NEG material 181 occurring after the sealing has been completed. However, when electronic device 100 is sealed before applying electrical power pulses in step 618, unless electronic device 100 contains pressure sensor 106, step 620 monitoring the pressure Y cannot be carried out.

Once the initial activation of NEG pump 180 has been completed, it may be advantageous to reactivate NEG pump 180 from time to time during its normal operation to maintain the desired pressure in interspace region 194 (see FIG. 2). For the embodiment shown in FIG. 1a the non-evaporable getter material is reactivated by applying sufficient electrical power pulses to NEG material 181 after a predetermined time.

Figure 7:
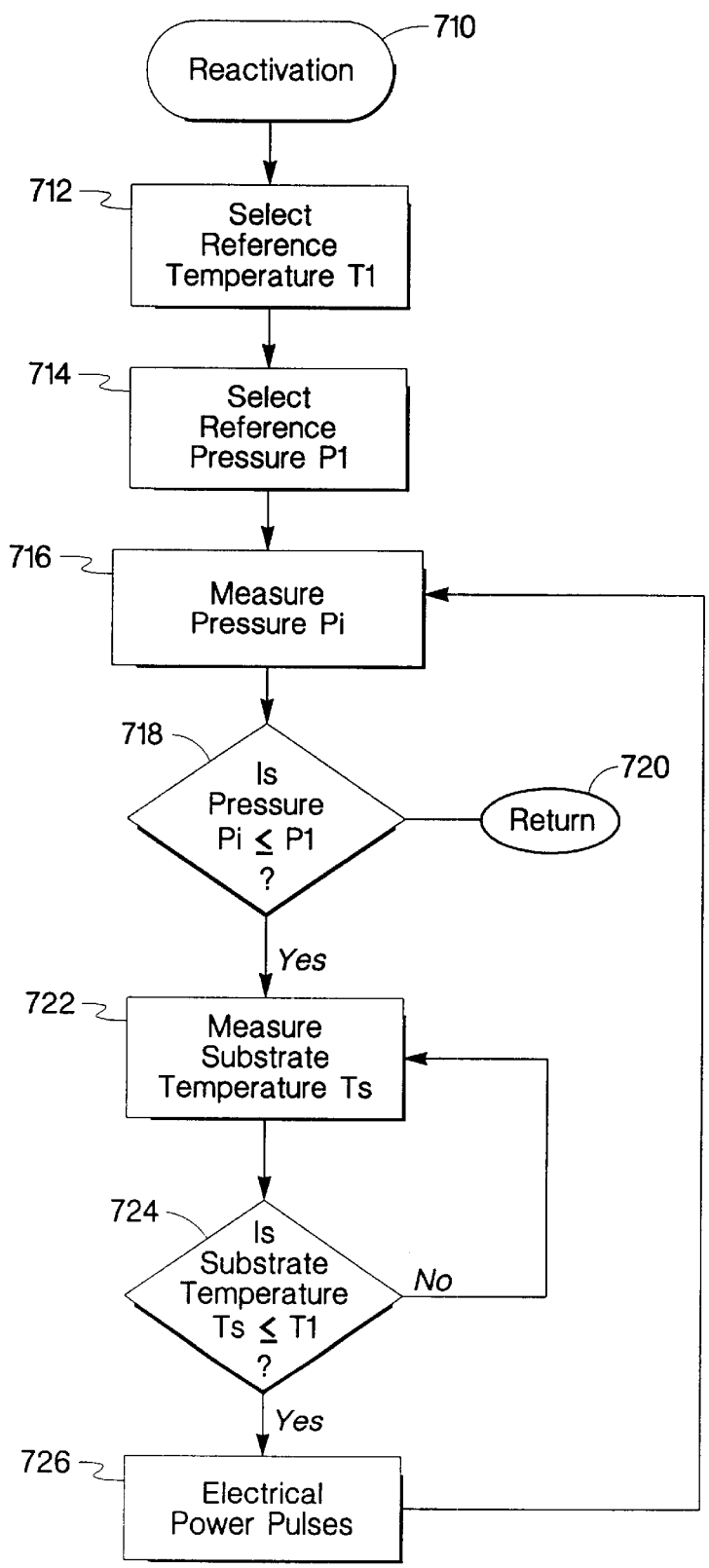
FIG. 7 is a flow diagram of a method for reactivating the NEG material according to an alternate embodiment of this invention.

FIG. 7 shows a flow diagram of a method for reactivating NEG pump 180 as shown in FIGS. 1b–1d that uses a subroutine labeled reactivation. Either at a pre-determined time (either fixed or calculated) or by monitoring the pressure in the interspace region 194 (see FIG. 2) from integrated pressure sensor 106 a reference temperature T1 and pressure P1 are selected in steps 712 and 714 respectively. Step 716 consists of determining the pressure Pi of interspace region 194. At step 718 the pressure is compared to reference pressure P1, if the pressure is less than the reference pressure P1 then the subroutine is exited. When, the measured pressure Pi is greater than the reference pressure P1, step 722 will be performed and substrate temperature Ts will be determined. In step 724 the substrate temperature is compared to reference temperature Ti, if substrate temperature Ts is less than or equal to reference temperature T1 then step 726 is performed and electrical power pulses are applied to NEG material 181 to heat NEG material 181 to its activation temperature. After step 726 is completed the subroutine returns to step 716. However, if substrate temperature Ts is greater than reference temperature Ti at step 724, then the subroutine moves back to step 722 to measure substrate temperature Ts again. Those skilled in the art will readily appreciate that a delay step waiting for a predetermined time or a calculated time utilizing the substrate temperature Ts and the pressure Pi can be inserted going from step 724 to 722.

Figure 8:
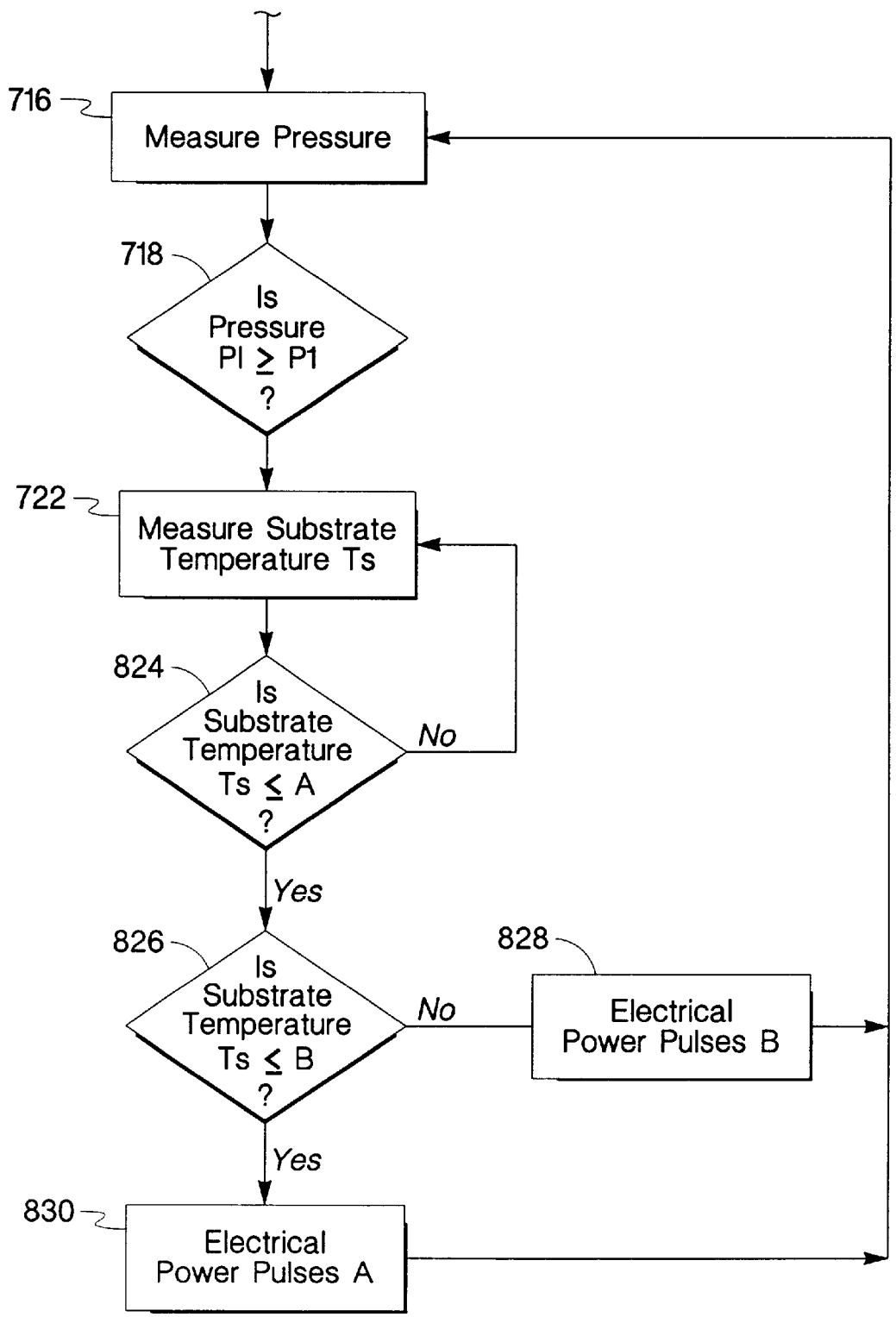
FIG. 8 is a flow diagram of a method for reactivating the NEG material according to an embodiment of this invention.

FIG. 8 shows a flow diagram of an alternate method of reactivating NEG pump 180 as shown in FIGS. 1b–1d. In this subroutine, steps 710–722 are the same as shown in FIG. 7. In step 824 substrate temperature Ts is compared to a first predetermined factor (A) where (A) is the desired maximum substrate temperature. If the substrate temperature is less than or equal to the first predetermined factor (A) then step 826 is performed. If substrate temperature Ts is greater than the first predetermined factor (A) then the subroutine moves back to step 722. At step 826 the substrate temperature Ts is compared to a second predetermined factor (B) where B is a safe operating condition allowing larger power pulses to be applied to NEG material 181. If the substrate temperature is less than or equal to the second predetermined factor (B) then step 830 is performed and electrical power pulses (A) are applied to NEG material 181 to heat NEG material 181 to its activation temperature. If at step 826 the substrate temperature is greater than the second predetermined factor then step 828 is performed and electrical power pulses (B) are applied to NEG material 181 to heat NEG material 181 to its activation temperature. In this embodiment, (B) represents a substrate temperature which is less than (A) signifying a lower substrate temperature which allows a greater amount of power to be applied in heating NEG material 181. After either step 828 or 830 is completed, then the subroutine moves back to step 716 to determine the pressure Pi of interspace region 194.

Figure 9:
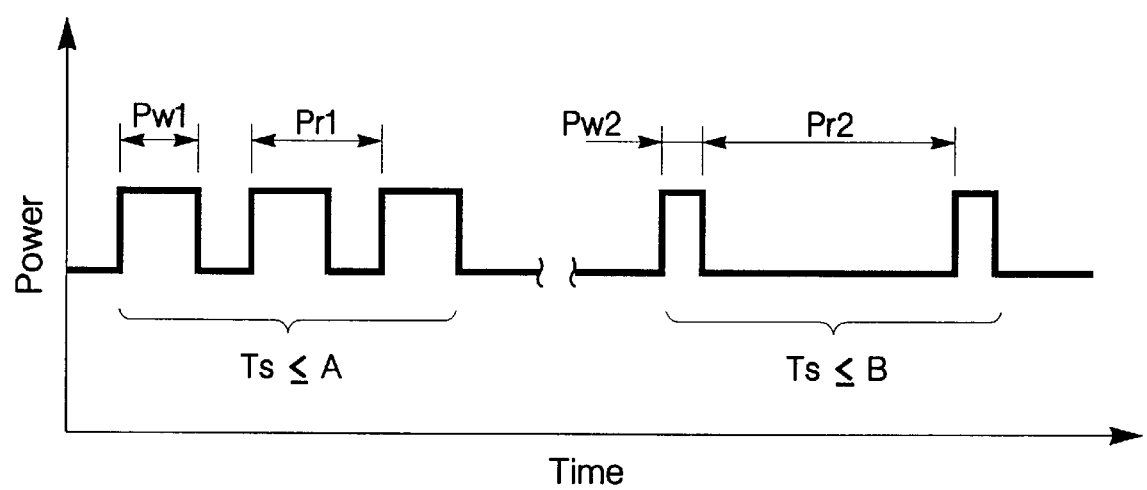
FIG. 9 is a timing diagram of electrical power pulses applied to the NEG material according to an embodiment of this invention.

FIG. 9 schematically illustrates the difference between electrical power pulses A and B. Electrical power pulses A have a pulse width Pw1 and pulse repetition period Pr1 and electronic power pulses B have a pulse width Pw2 and pulse repetition where Pw1 greater than Pw2 and Pr1 is less than Pr2. Going back to step 826 shown in FIG. 8 we see that as the substrate temperature Ts increases the power applied to NEG material 181 is decreased. Those skilled in the art will appreciate, that either the pulse width or pulse repetition period can be varied independently to accomplish the same reduction in power applied to NEG material 181.

What is claimed is:

1. An electronic device sealed under vacuum comprising:
a substrate;
a transistor formed on the substrate;
a dielectric layer covering at least a portion of the transistor,
a layer of non-evaporable getter material disposed on a portion of the dielectric layer; and a vacuum device disposed on a portion of the substrate; wherein the non-evaporable getter material is activated by electrical power pulses.

2. The electronic device of claim 1, wherein the vacuum device is electrically isolated from the transistor by the dielectric layer.

3. The electronic device of claim 1, wherein the vacuum device is coupled to the transistor.

4. The electronic device of claim 1, further comprising a second transistor wherein the second transistor is coupled to the layer of non-evaporable getter material.

5. The electronic device of claim 1, further comprising a layer of electrically resistive material in thermal communication with the layer of non-evaporable getter material.

6. The electronic device of claim 1, further comprising a substrate temperature sensor disposed on the substrate, wherein the substrate temperature sensor monitors a substrate temperature to limit damage to the transistor when heating the non-evaporable getter material.

7. The electronic device of claim 1, further comprising a pressure sensing device, wherein the pressure sensing device monitors a pressure to determine when to reactivate the non-evaporable getter material.

8. The electronic device of claim 1, further comprising:
a cover;
a vacuum seal attached to the substrate and to the cover wherein the vacuum seal, the substrate and the cover define an interspace region and provide a package enclosing the layer of non-evaporable getter material and enclosing the vacuum device.

9. The electronic device of claim 1, further comprising a pump driver, wherein the pump driver provides electrical power pulses to activate the non-evaporable getter material.

10. The electronic device of claim 9, wherein the pump driver further comprises a pulse generator for generating electrical power pulses.

11. The electronic device of claim 10, further comprising a substrate temperature sensor disposed on the substrate and coupled to the pulse generator wherein the substrate temperature sensor monitors a temperature of the substrate to hinder damage to the transistor when heating the non-evaporable getter material.

12. The electronic device of claim 10, further comprising a pressure sensor disposed on the substrate and coupled to the pulse generator, wherein the pressure sensor monitors a pressure to determine when to reactivate the non evaporable getter material.

13. The electronic device of claim 10, wherein the pulse generator generates electrical power pulses of a predetermined pulse width and a predetermined pulse repetition period.

14. The electronic device of claim 13, further comprising a processing unit coupled to the pulse generator to generate a second pulse width that is less than the predetermined pulse width and to generate a second pulse repetition period that is greater than the predetermined pulse repetition period.

15. The electronic device of claim 14, further comprising a reference temperature which establishes a predetermined maximum value for a substrate temperature.

16. The electronic device of claim 14, further comprising a reference temperature which establishes a predetermined maximum value for a package pressure.

17. The electronic device of claim 1, wherein the layer of non-evaporable getter material further comprises an array of non-evaporable getter material portions disposed on a portion of the dielectric layer.

18. The electronic device of claim 17, wherein the substrate has a periphery and the array of non-evaporable getter material portions is disposed around the periphery of the substrate.

19. The electronic device of claim 1, where in the dielectric layer is comprised of a dielectric material selected from the group consisting of silicon oxide, silicon dioxide, silicon carbide, silicon nitride, aluminum oxide and boron nitride.

20. The electronic device of claim 1, wherein the dielectric layer further comprises:
a first dielectric layer, the first dielectric layer being comprised of silicon oxide;
a second dielectric layer, the second dielectric layer being comprised of silicon nitride;
a third dielectric layer, the third dielectric layer being comprised of silicon carbide.

21. The electronic device of claim 1, wherein the transistor is a metal oxide semiconductor field effect transistor.

22. The electronic device of claim 1, wherein the transistor is a bipolar junction transistor.

23. The electronic device of claim 1, wherein the non-evaporable getter material comprises material selected from the group consisting of molybdenum, titanium, thorium, and zirconium and combinations thereof.

24. The electronic device of claim 1, wherein the non-evaporable getter material further comprises a 0.1 micron to 1.0 micron thick layer.

25. The electronic device of claim 1, wherein the non-evaporable getter material further comprises a 1.0 micron to 10 micron thick layer.

26. The electronic device of claim 1, wherein the non-evaporable getter material further comprises a 10 micron to 150 micron thick layer.

27. The electronic device of claim 1, wherein the non-evaporable getter material is comprised of a metal, selected from the group consisting of Zr—Al alloys, Zr—V alloys, Zr—V—Fe alloys, and combinations thereof.

28. An electronic device sealed under vacuum comprising:
a silicon substrate;
a transistor formed on the substrate;
a vacuum device disposed on the substrate and coupled to the transistor;
a dielectric layer covering at least a portion of the transistor;
a layer of electrically resistive material disposed on the dielectric layer, wherein the layer of electrically resistive material comprises at least one metal therein;
a conductive layer disposed on a portion of the electrically resistive material having at least one uncovered portion, wherein the conductive layer is absent therefrom, and wherein the at least one uncovered portion is an energy dissipater, and the conductive layer comprises at least one metal therein; and
a layer of getter material disposed on the at least one uncovered portion of the layer of electrically resistive material;
wherein the getter material is activated by electrical power pulses.

29. The electronic device of claim 28, further comprising a second transistor formed on the substrate, wherein the layer of getter material is coupled to the second transistor.

30. A method of operating a non-evaporable getter pump disposed on an electronic device substrate having transistors comprising the steps of:
evacuating the electronic device to a first pressure;
apply energy to the electronic device to desorb particles from exposed surfaces;
sealing the electronic device; and applying electrical power pulses heating a non-evaporable getter material to an activation temperature wherein the transistors are maintained at a reduced temperature.

31. The method of claim 30, further comprising the step of reactivating the non-evaporable getter material after a predetermined time.

32. The method of claim 30, further comprising the steps of:

selecting a reference temperature;

measuring a substrate temperature;

comparing the reference temperature to the substrate temperature to determine if the substrate temperature is below the reference temperature by a first predetermined factor; and if so, then heating the non-evaporable getter material to an activation temperature by applying electrical power pulses having a first predetermined width and a first predetermined repetition rate.

33. The method of claim 32, further comprising the steps of:

comparing the reference temperature to the substrate temperature to determine if the substrate temperature is below the reference temperature by a second predetermined factor, wherein the second predetermined factor is less than the first predetermined factor; and if so, then heating the non-evaporable getter material to an activation temperature by applying electrical power pulses having a second predetermined width that is less than the first predetermined width and a second predetermined repetition rate that is greater than the first predetermined repetition rate.

34. The method of claim 30, further comprising the step of measuring a pressure within the electronic device using a pressure sensor on the substrate.

35. A method of operating a non-evaporable getter pump disposed on an electronic device substrate having active devices comprising the steps of:

evacuating the electronic device to a first pressure;

heating the electronic device to a first temperature;

sealing the electronic device;

cooling the electronic device to a second temperature;

applying electrical power pulses of a variable width heating a non-evaporable getter material to an activation temperature wherein a sensing circuit varies the width of the electrical power pulses to control the activation temperature of the non-evaporable getter material wherein the active devices are maintained at a reduced temperature.

* * * * *

UNITED STATES PATENT AND TRADEMARK OFFICE
CERTIFICATE OF CORRECTION

PATENT NO. : 6,534,850 B2
DATED : March 18, 2003
INVENTOR(S) : Liebeskind

It is certified that error appears in the above-identified patent and that said Letters Patent is hereby corrected as shown below:

Column 10,
Line 1, delete "where in" and insert therefor -- wherein --.

Signed and Sealed this

Twenty-third Day of December, 2003

JAMES E. ROGAN
*Director of the United States Patent and Trademark Office*